United States Patent
Yu et al.

(10) Patent No.: US 11,320,708 B2
(45) Date of Patent: May 3, 2022

(54) ARRAY SUBSTRATE AND METHOD FOR FABRICATING SAME, AND METHOD FOR DETECTING ALIGNMENT ACCURACY

(71) Applicant: TCL China Star Optoelectronics Technology Co., Ltd., Shenzhen (CN)

(72) Inventors: ChingWen Yu, Shenzhen (CN); Junling Huang, Shenzhen (CN); Feihui Huang, Shenzhen (CN); Hua Jiang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 144 days.

(21) Appl. No.: 16/759,357

(22) PCT Filed: Nov. 29, 2019

(86) PCT No.: PCT/CN2019/121906
§ 371 (c)(1),
(2) Date: Apr. 27, 2020

(87) PCT Pub. No.: WO2021/072930
PCT Pub. Date: Apr. 22, 2021

(65) Prior Publication Data
US 2021/0405476 A1     Dec. 30, 2021

(30) Foreign Application Priority Data

Oct. 14, 2019  (CN) .......................... 201910971862.1

(51) Int. Cl.
*G02F 1/1362*     (2006.01)
*G01B 11/27*      (2006.01)
(Continued)

(52) U.S. Cl.
CPC ...... *G02F 1/136222* (2021.01); *G01B 11/272* (2013.01); *G02F 1/1368* (2013.01);
(Continued)

(58) Field of Classification Search
None
See application file for complete search history.

(56) References Cited

U.S. PATENT DOCUMENTS

2009/0261333 A1  10/2009  Chang et al.
2010/0320468 A1  12/2010  Kamata et al.
(Continued)

FOREIGN PATENT DOCUMENTS

CN    1470907       1/2004
CN    103427023    12/2013
(Continued)

*Primary Examiner* — Bo B Jang

(57) ABSTRACT

The present disclosure provides an array substrate and a method for fabricating the same, a method for detecting alignment accuracy, and a liquid crystal display panel, wherein a dummy color resist unit is disposed on a periphery of a display area of a substrate, and a side or a center point of the dummy color resist unit is designed to be at a predetermined distance from an adjacent signal line. Therefore, it is only necessary to measure a distance between the side or the center point of the dummy color resist unit and a signal line adjacent to it, and compare the measured distance with the predetermined distance to estimate alignment accuracy of color resist units. It is not necessary to dispose detection units in a non-display area of the array substrate so that an area of the non-display area can be reduced to achieve ultra-narrow frame design.

7 Claims, 7 Drawing Sheets

(51) Int. Cl.
    *G02F 1/1368*    (2006.01)
    *H01L 27/12*    (2006.01)
(52) U.S. Cl.
    CPC ...... *G02F 1/136286* (2013.01); *H01L 27/124* (2013.01); *H01L 27/1248* (2013.01); *H01L 27/1259* (2013.01)

(56) References Cited

U.S. PATENT DOCUMENTS

| | | | |
|---|---|---|---|
| 2013/0313530 A1 | 11/2013 | Seo et al. | |
| 2015/0187821 A1 | 7/2015 | Kim et al. | |
| 2016/0202544 A1* | 7/2016 | Ro | G02B 5/201 |
| | | | 359/890 |
| 2017/0090227 A1 | 3/2017 | Yun et al. | |
| 2018/0143471 A1* | 5/2018 | Park | G02F 1/13394 |
| 2020/0026135 A1* | 1/2020 | Ki | G02F 1/134309 |

FOREIGN PATENT DOCUMENTS

| | | |
|---|---|---|
| CN | 104749841 | 7/2015 |
| CN | 107658234 | 2/2018 |
| CN | 108196408 | 6/2018 |

* cited by examiner

ARRAY SUBSTRATE AND METHOD FOR FABRICATING SAME, AND METHOD FOR DETECTING ALIGNMENT ACCURACY

RELATED APPLICATIONS

This application is a National Phase of PCT Patent Application No. PCT/CN2019/121906 having International filing date of Nov. 29, 2019, which claims the benefit of priority of Chinese Patent Application No. 201910971862.1 filed on Oct. 14, 2019. The contents of the above applications are all incorporated by reference as if fully set forth herein in their entirety.

FIELD AND BACKGROUND OF THE INVENTION

The present disclosure relates to the field of thin-film transistor liquid-crystal display (TFT-LCD) technology, and particularly to a COA (color filter on array) array substrate and a method for fabricating the same, a method for detecting alignment accuracy, and a liquid crystal display panel.

In the prior art, in order to detect alignment accuracy of a color resist layer in a COA (color filter on array) array substrate, a plurality of detection units are generally disposed in a non-display area of the COA array substrate to detect whether positions of color resist units in the color resist layer match designed positions of color resist units. Please refer to FIG. 1 and FIG. 2. FIG. 1 is a schematic diagram of a COA array substrate 10 provided with detection units 20 in the prior art. FIG. 2 is a schematic diagram of a detection unit 20 in the prior art. In the prior art, a plurality of detection units 20 are generally provided in a non-display area 14 of a COA array substrate 10 to detect alignment accuracy of a color resist layer (not shown) in a display area 12. A typical detection unit 20 comprises a metal frame 22 and a color resist block 24 disposed in the metal frame 22. The color resist block 24 is formed simultaneously with the color resist layer. The metal frame 22 is usually simultaneously formed with a gate electrode. By measuring a distance between each side of the color resist block 24 and a side of the metal frame 22 adjacent to and parallel to it, and comparing the measured distance with a designed distance, alignment accuracy of the color resist layer is estimated.

Currently, narrow-frame liquid-crystal display panels are favored by users because of their high screen ratio. Therefore, how to achieve ultra-narrow frame design has become a focus of research and development in enterprises. However, with the development of technology, design of traces in a non-display area of a COA array substrate becomes more complicated. Therefore, if additional detection units are still to be disposed in a non-display area of a COA array substrate, it will limit narrowing of a frame of a display panel. Please refer to FIG. 1 and FIG. 2, disposing the additional detection units 20 in the non-display area 14 will limit narrowing of the non-display area 14. Therefore, it is necessary to develop a new array substrate and a method for fabricating the same, a method for detecting alignment accuracy, and a liquid crystal display panel to solve the above technical problems.

SUMMARY OF THE INVENTION

In order to solve the above technical problem, the present disclosure provides a method of fabricating an array substrate. The method comprises: providing a substrate comprising a display area; forming a plurality of thin-film transistors and a plurality of signal lines on the display area of the substrate, wherein each of the thin-film transistors comprises a gate electrode layer electrically connected to a corresponding signal line; and forming a plurality of color resist units on the thin-film transistors in the display area while forming a dummy color resist unit on a periphery of the display area of the substrate, wherein a side or a center point of the dummy color resist unit is designed to be at a predetermined distance from one of the signal lines.

The present disclosure further provides an array substrate comprising a substrate, a plurality of thin-film transistors, a plurality of signal lines, a plurality of color resist units, and a dummy color resist unit. The substrate comprises a display area. The thin-film transistors are disposed on the display area of the substrate. Each of the thin-film transistors comprises a gate electrode layer. The signal lines are disposed on the display area of the substrate and electrically connected to the gate electrode layers of the thin-film transistors. The color resist units are disposed on the thin-film transistors in the display area. The dummy color resist unit is disposed on a periphery of the display area of the substrate. A side or a center point of the dummy color resist unit is designed to be at a predetermined distance from one of the signal lines.

The present disclosure further provides a liquid crystal display panel comprising the aforementioned array substrate. The present disclosure further provides a method for detecting alignment accuracy of a color resist layer. The method comprises providing an array substrate comprising a display area. The display area is provided with a plurality of thin-film transistors, a plurality of signal lines electrically connected to the thin-film transistors, a plurality of color resist units disposed on the thin-film transistors, and a dummy color resist unit disposed on a periphery of the display area. A side or a center point of the dummy color resist unit is designed to be at a predetermined distance from one of the signal lines. After providing the array substrate, the method further comprises measuring a distance of the side or the center point of the dummy color resist unit to the signal line designed to be at the predetermined distance from the side or the center point and comparing the measured distance with the predetermined distance.

In an embodiment, the dummy color resist unit is formed at a corner or a side of the display area of the substrate.

In an embodiment, the dummy color resist unit is shaped as a triangle, a quadrangle, a hexagon, an octagon, a circle, an L-shape, a T-shape, a cross shape, or a combination thereof.

In an embodiment, the dummy color resist unit is shaped as a quadrangle, and each side thereof is designed to be at the predetermined distance from a signal line adjacent and parallel thereto.

In an array substrate and a method for fabricating the same, a method for detecting alignment accuracy, and a liquid crystal display panel which are provided by embodiments of the present disclosure, a dummy color resist unit is disposed on a periphery of a display area of a substrate, and each side of the dummy color resist unit is designed to be at a predetermined distance from an adjacent signal line. The sides of the dummy color resist unit have different, same, or partially-same predetermined distances. Therefore, it is only necessary to measure a distance between each side of the dummy color resist unit and a signal line adjacent to it, and compare the measured distance with the predetermined distance to estimate alignment accuracy of color resist units. The array substrate and the method for fabricating the same, the method for detecting alignment accuracy, and the liquid crystal display panel do not need to dispose detection units in a non-display area of the array substrate, so that an area of the non-display area can be reduced to achieve ultra-narrow frame design of the display panel. This solves the problem of limiting narrowing of a frame of a display panel due to detection units being disposed in a non-display area of a COA array substrate in the prior art.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
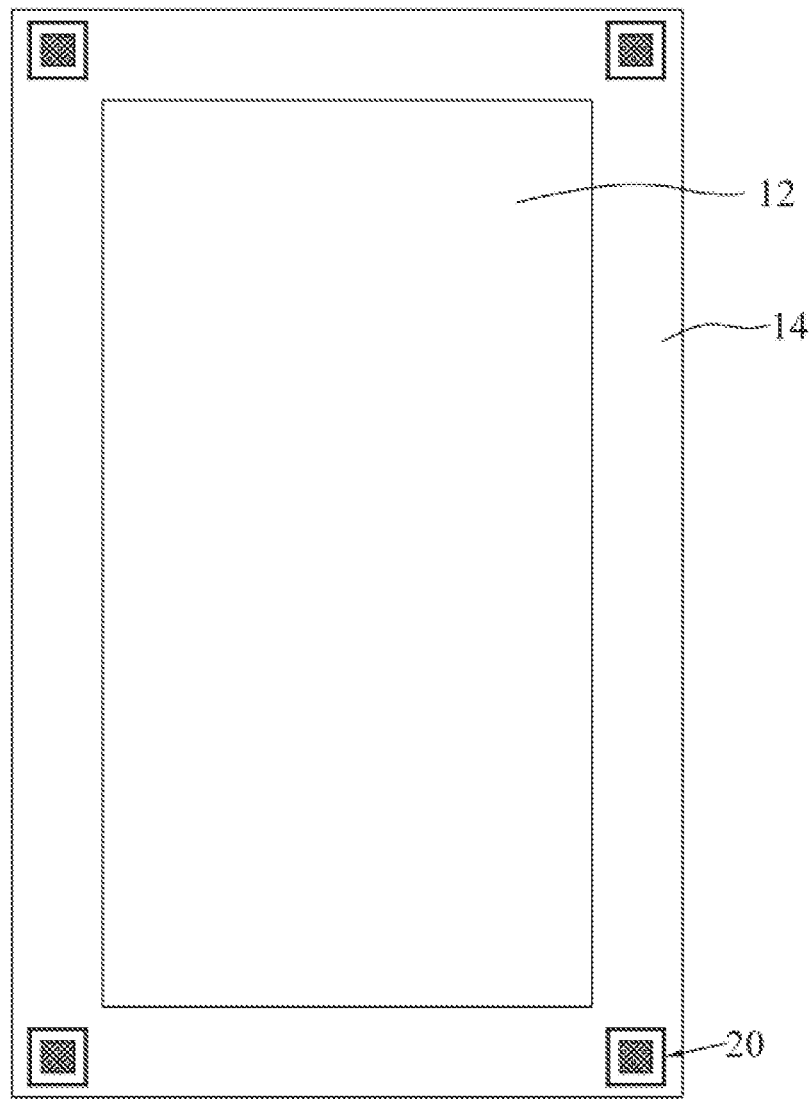
FIG. 1 is a schematic diagram of a COA (color filter on array) array substrate provided with detection units in the prior art.
Figure 2:
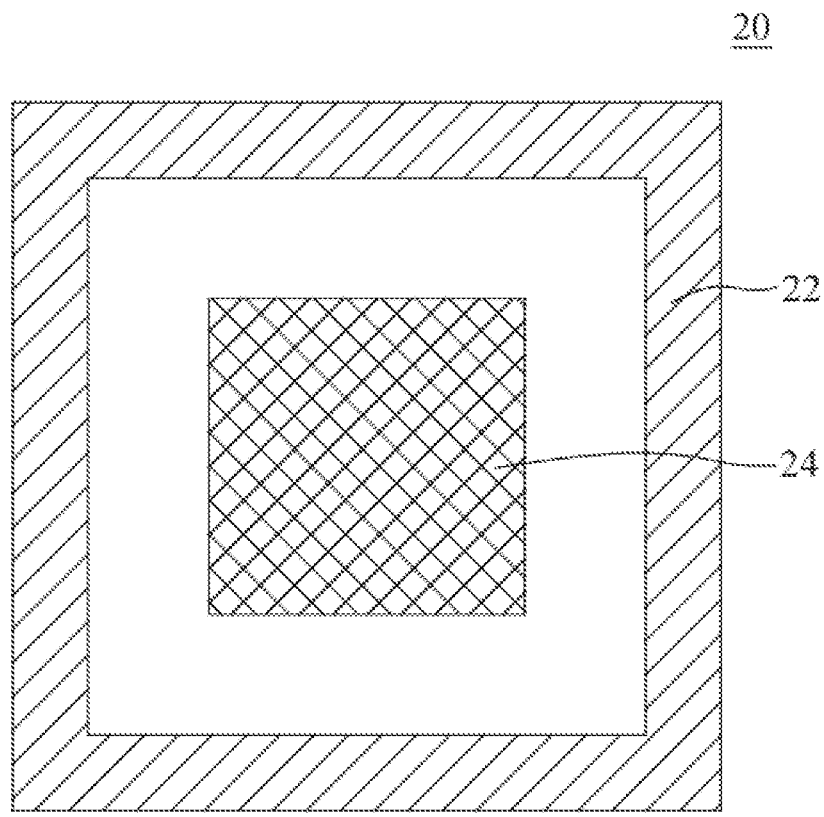
FIG. 2 is a schematic diagram of a detection unit in the prior art.
Figure 3:
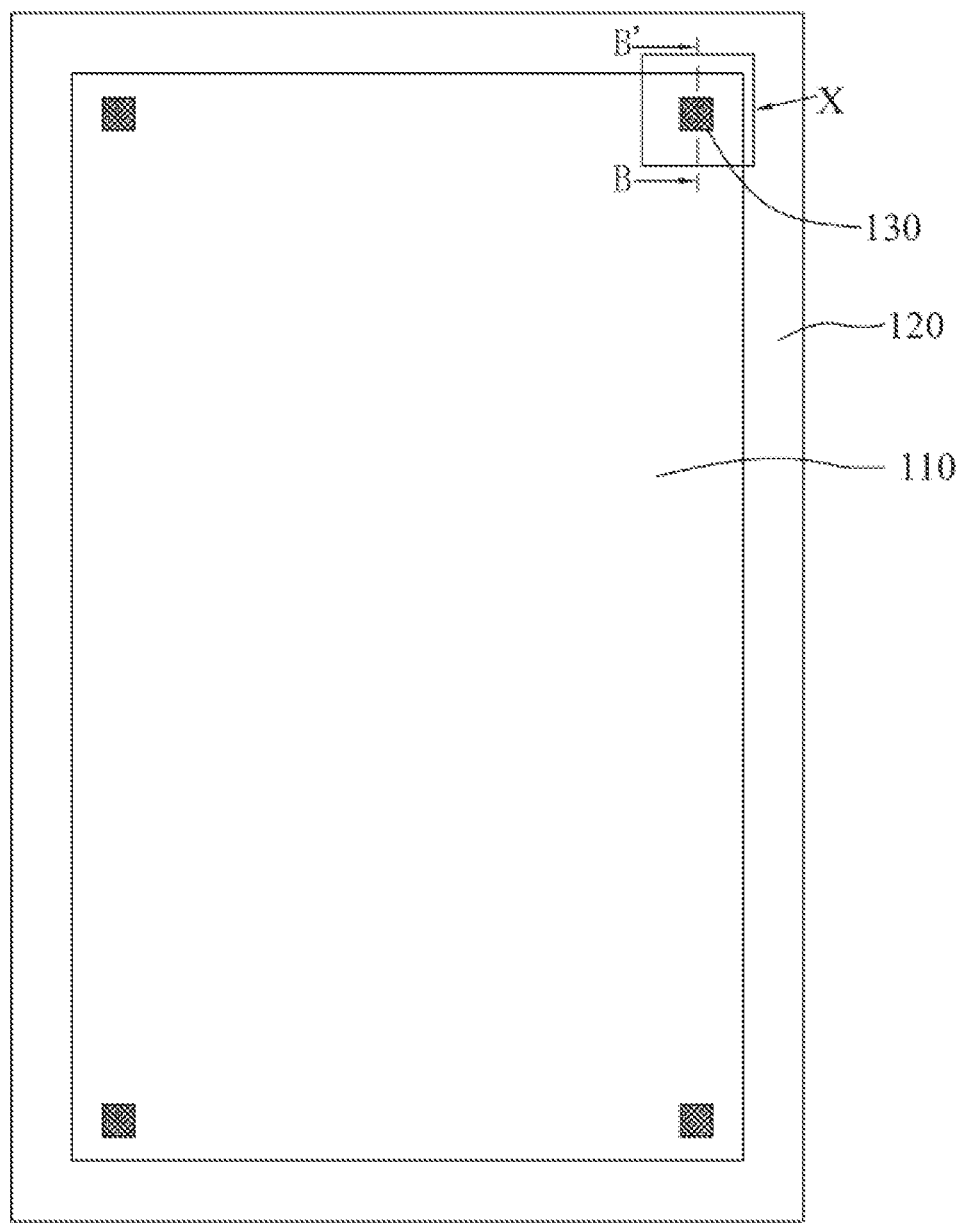
FIG. 3 is a schematic diagram of a COA array substrate provided with dummy color resist units according to an embodiment of the present disclosure.
Figure 4:
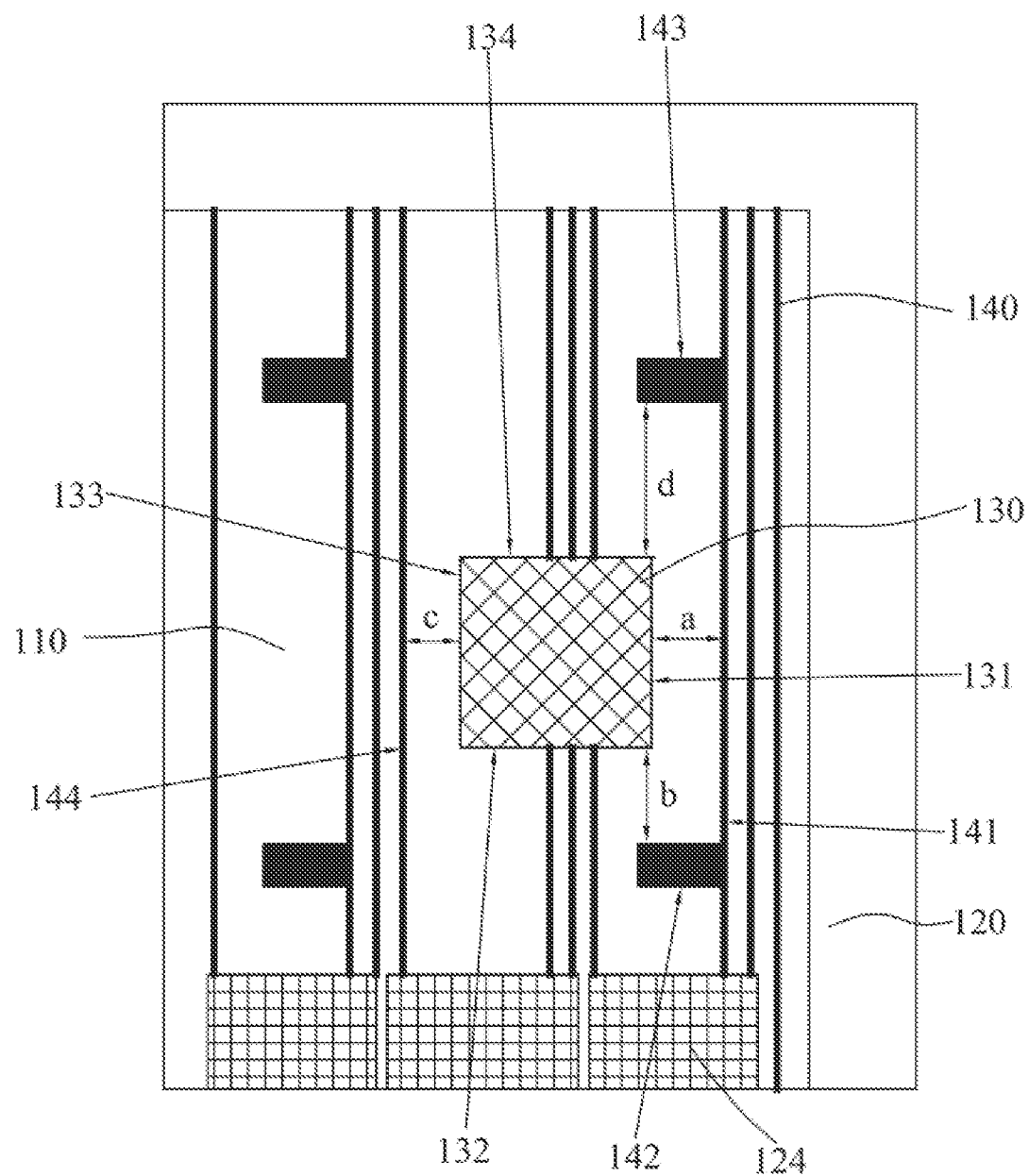
FIG. 4 is an enlarged view of an X region in FIG. 3.
Figure 5:
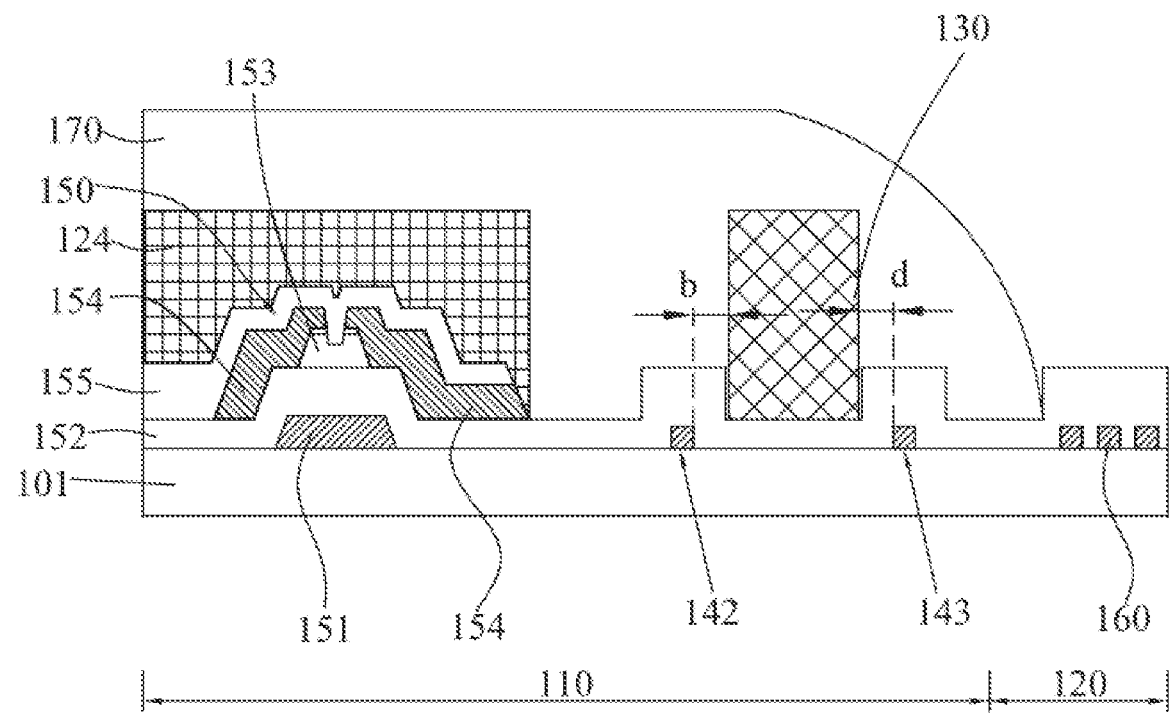
FIG. 5 is a sectional view taken along line B-B' in FIG. 3.
Figure 6:
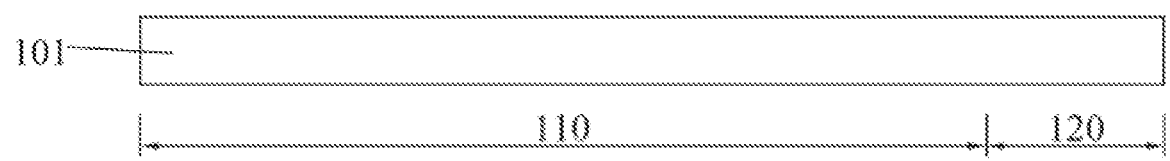
FIG. 6, FIG. 7, FIG. 8, FIG. 9 and FIG. 10 are schematic flowcharts of a method for fabricating an array substrate according to an embodiment of the present disclosure as shown in FIG. 5.
Figure 7:
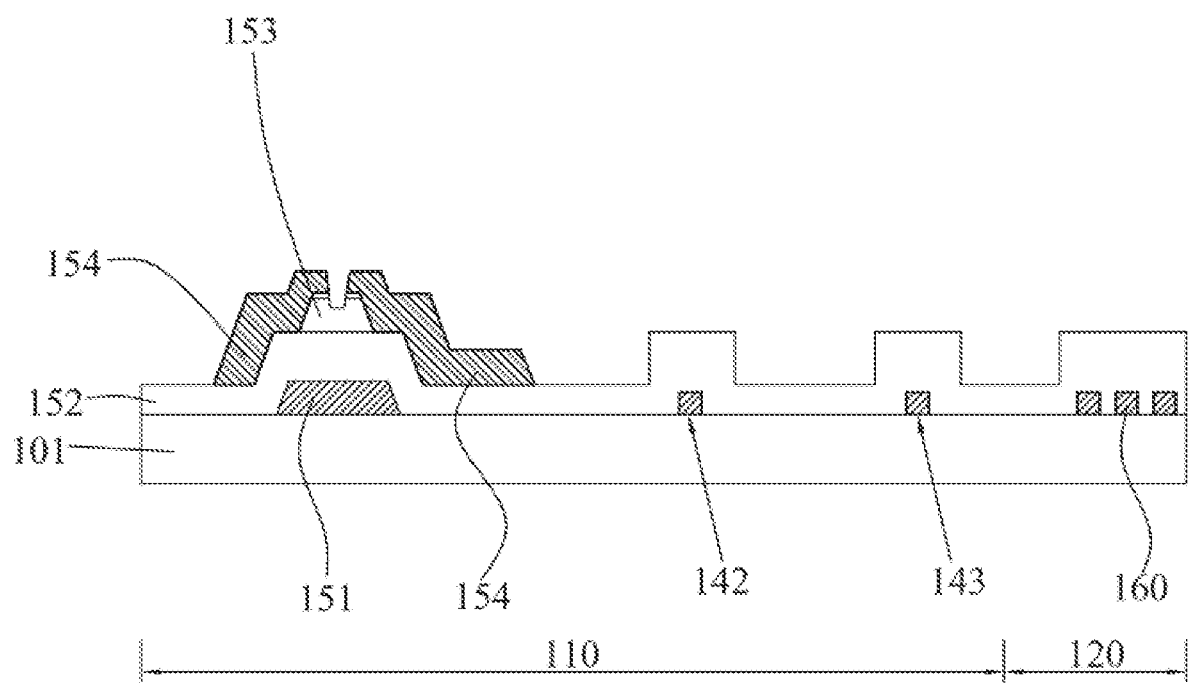
Figure 8:
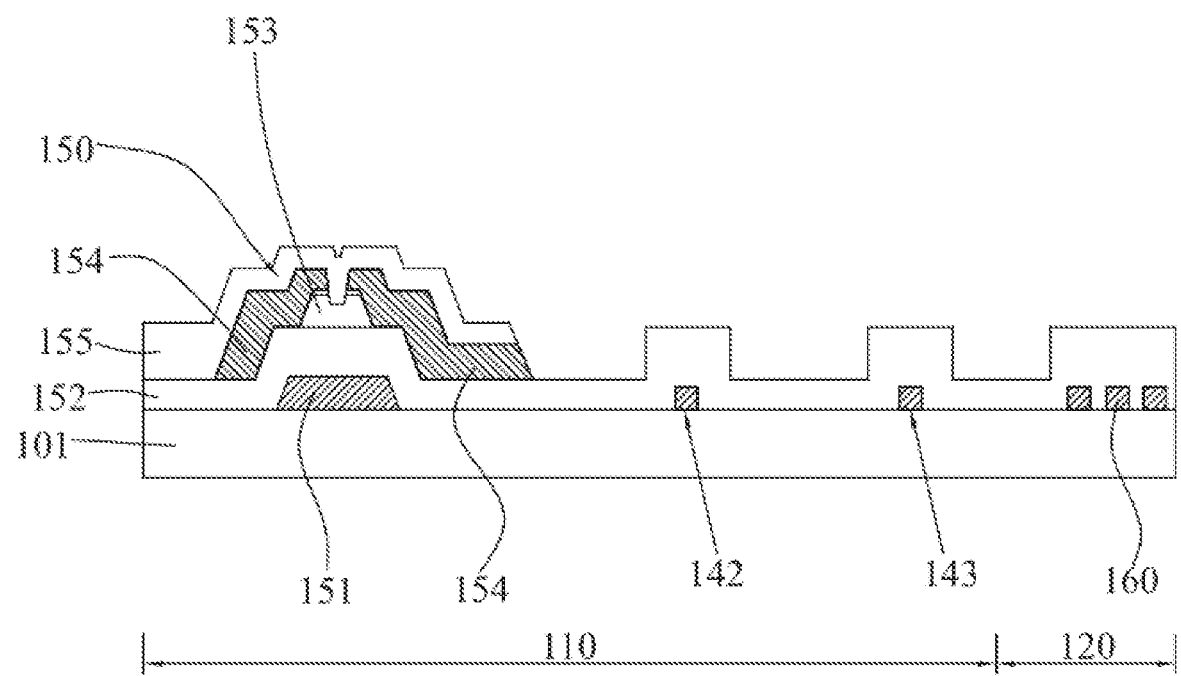
Figure 9:
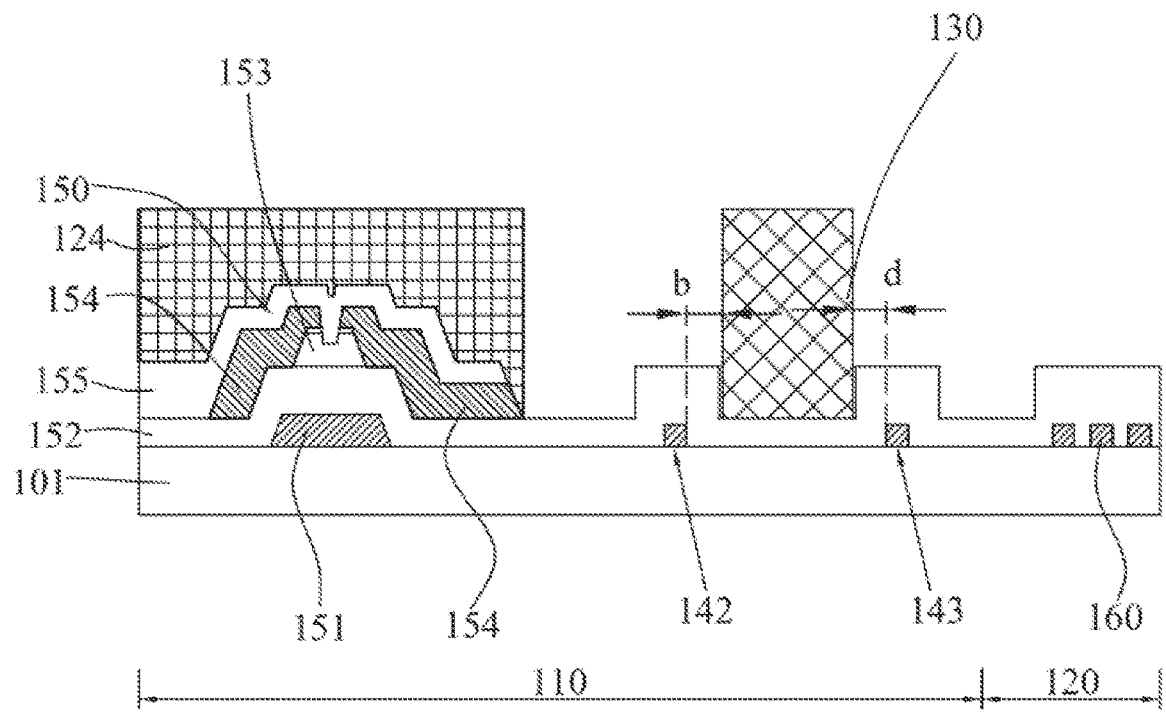
Figure 10:
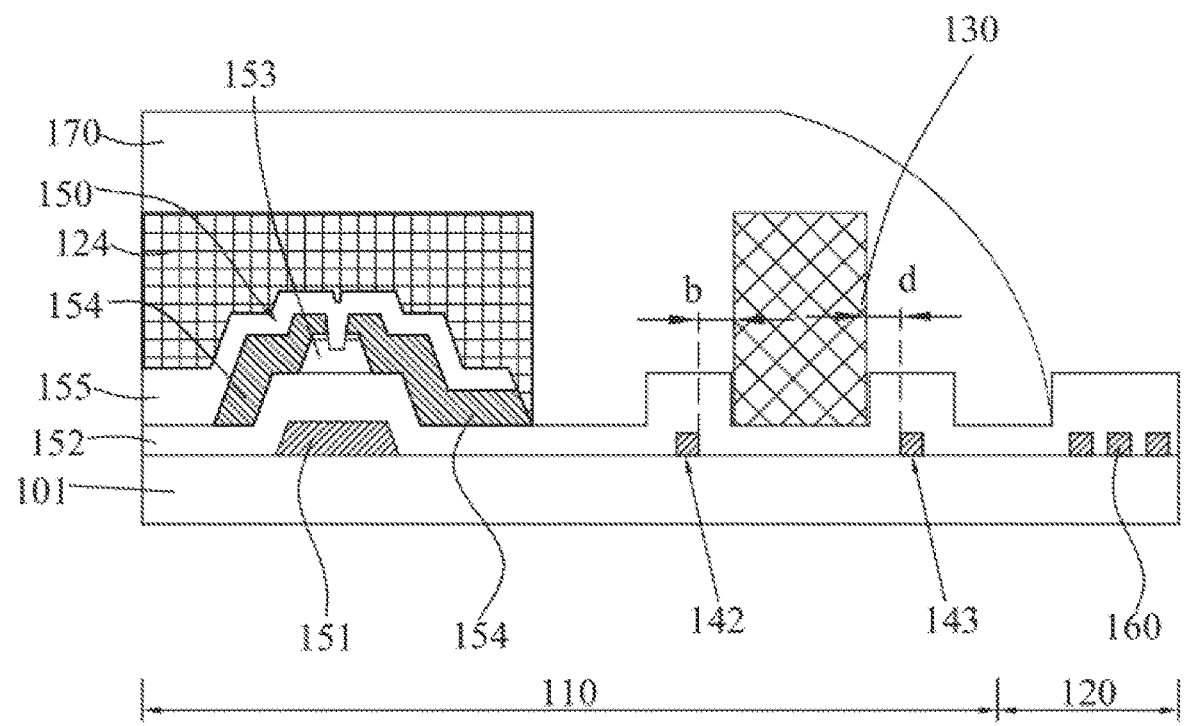

Please refer to FIG. 3 to FIG. 10. FIG. 3 is a schematic diagram of a COA array substrate 100 provided with dummy color resist units 130 according to an embodiment of the present disclosure. FIG. 4 is an enlarged view of an X region in FIG. 3. FIG. 5 is a sectional view taken along line B-B in FIG. 3. FIG. 6 to FIG. 10 are schematic flowcharts of a method for fabricating an array substrate according to an embodiment of the present disclosure as shown in FIG. 5. The present disclosure provides a method of fabricating an array substrate comprising steps S1-S3.

Step S1: providing a substrate 101 comprising a display area 110 and a non-display area 120 surrounding the display area 110. The substrate 101 may be a rigid substrate, such as a glass substrate, but is not limited thereto.

Step S2: forming a plurality of thin-film transistors 150 and a plurality of signal lines 140 on the display area 110 of the substrate 101. Each of the thin-film transistors 150 comprises a gate electrode layer 151, an insulating layer 152, an active layer 153, and a source-drain layer 154. The signal lines 140 and the gate electrode layer 151 of the thin-film transistors 150 are made of a same material at a same time and are electrically connected to each other.

Step S3: forming a plurality of color resist units 124 on the thin-film transistors 150 and the substrate 101 in the display area 110, and simultaneously forming a dummy color resist unit 130 on a periphery of the display area 110 of the substrate 101 with a same material as the color resist units 124. A side or a center point of the dummy color resist unit 130 is designed to be at a predetermined distance from one of the signal lines 140. The color resist units 124 may be red, blue, and green photoresist blocks. The red, blue, and green photoresist blocks may be arranged in a triangular configuration, a square configuration, a linear configuration, or a mosaic configuration in the display area 110. The color resist units 124 may be made by using a dyeing method, an etching method, a printing method, a dry film method, or an electrodeposition method, but is not limited thereto. The dummy color resist unit 130 may be a red, blue or green photoresist block. Specifically, the dummy color resist unit 130 is made of a same material as the red, blue, or green photoresist blocks of the color resist units 124.

In an embodiment, the dummy color resist unit 130 is disposed at a corner or a side of the display area 110 of the substrate 101. In an embodiment, a number of the dummy color resist unit 130 may be two, which are respectively disposed at two diagonally opposite corners, two corners of a same side, two opposite sides, or two adjacent sides of the display area 110. In an embodiment, the number of the dummy color resist unit 130 may be four, which are respectively disposed on four corners or four sides of the display area 110. However, the number and a set position of the dummy color resist unit 130 are not limited thereto.

In an embodiment, the dummy color resist unit 130 may be designed as a triangle, a quadrangle, a hexagon, an octagon, a circle, an L-shape, a T-shape, a cross shape, or other suitable shapes. Preferably, the dummy color resist unit 130 is shaped as a quadrangle and has a first side 131, a second side 132, a third side 133, and a fourth side 134. The signal lines 140 comprise a first signal line 141, a second signal line 142, a third signal line 143, and a fourth signal line 144 which are adjacent to and parallel to the first side 131, the second side 132, the third side 133, and the fourth side 134, respectively. The dummy color resist unit 130 is set as follows: the first side 131 is at a predetermined distance a from the first signal line 141, the second side 132 is at a predetermined distance b from the second signal line 142, the third side 133 is at a predetermined distance c from the third signal line 143, and the fourth side 134 is at a predetermined distance d from the fourth signal line 144. The predetermined distances a, b, c, and d may be equal, unequal, or partially equal.

In an embodiment, step S2 further comprises: forming a plurality of driving circuits 160 on the non-display area 120 of the substrate 101. The driving circuits 160 are made of a same material as the gate electrode layers 151 of the thin-film transistors 150 and the signal lines 140. The driving circuits 160 are electrically connected to the signal lines 140 and a common voltage generating circuit (not shown). The common voltage generating circuit is configured to generate a common voltage. The common voltage makes the driving circuits 160 to generate driving signals to the gate electrode layers 151 of the thin-film transistors 150 to control switching of the thin-film transistors 150.

In an embodiment, the insulating layers 152 of the thin-film transistors 150 extend to cover the signal lines 140 and the driving circuits 160.

In an embodiment, after step S2, the method further comprises step S21: forming a protective layer 155 to cover the thin-film transistors 150. The protective layer 155 is made of an insulating material. The protective layer 155 may be made of a polymer insulating material such as epoxy resin, acrylic resin, polyimide resin, and polyvinyl alcohol resin, but is not limited thereto.

In an embodiment, after step S3, the method further comprises step S32: forming an overcoat layer 170 to cover the color resist units 124 and the dummy color resist unit 130.

In an embodiment, between step S3 and step S32, the method further comprises step S31: forming a light-shielding layer (i.e., a black matrix (BM), not shown). The light-shielding layer 122 is configured to shield areas other than the color resist units 124 to (1) prevent light leakage from a backlight of a thin-film transistor liquid-crystal display, thereby improving a contrast ratio of the display; (2) prevent three primary color lights, generated by light from the backlight passing through adjacent red, blue, and green photoresist blocks of the color resist units 124, from being mixed, thereby improving color purity of the display, and (3) prevent light from causing malfunction of the thin-film transistor 111 and changing the operating parameters of the thin-film transistors 111. The light-shielding layer 122 may be composed of a black resin, a single-layer of chromium (Cr), or a double-layer of chromium (Cr)/chromium oxide (CrOx).

In an embodiment, after step S32, the method further comprises step S33: forming a plurality of columnar photo spacers (not shown) on the overcoat layer in the display area to prevent a cell gap of the display from being changed due to pressure. The photo spacers have a same height to maintain uniformity of the cell gap.

The present disclosure further provides an array substrate 100 made by the above method. The array substrate 100 comprises a substrate 101, a plurality of thin-film transistors 150, a plurality of signal lines 140, a plurality of color resist units 124, and a dummy color resist unit 130. The substrate 101 comprises a display area 110 and a non-display area 120 surrounding the display area 110. The substrate 101 may be a rigid substrate, such as a glass substrate, but is not limited thereto. The thin-film transistors 150 are disposed on the display area 110 of the substrate 101. Each of the thin-film transistors 150 comprises a gate electrode layer 151, an insulating layer 152, an active layer 153, and a source-drain layer 154. The signal lines 140 are disposed on the display area 110 of the substrate 101. The signal lines 140 and the gate electrode layer 151 of the thin-film transistors 150 are made of a same material and are electrically connected to each other. The color resist units 124 are disposed on the thin-film transistors 150 and the substrate 101 in the display area 110. The color resist units 124 may be red, blue, and green photoresist blocks. The red, blue, and green photoresist blocks may be arranged in a triangular configuration, a square configuration, a linear configuration, or a mosaic configuration in the display area 110. The color resist units 124 may be made by using a dyeing method, an etching method, a printing method, a dry film method, or an electrodeposition method, but is not limited thereto. The dummy color resist unit 130 is disposed on a periphery of the display area 110 of the substrate 101. The dummy color resist unit 130 is made of a same material as the color resist units 124. A side or a center point of the dummy color resist unit 130 is designed to be at a predetermined distance from one of the signal lines 140. The dummy color resist unit 130 may be a red, blue, or green photoresist block. Specifically, the dummy color resist unit 130 is made of a same material as the red, blue, or green photoresist blocks of the color resist units 124.

In an embodiment, the dummy color resist unit 130 is disposed at a corner or a side of the display area 110 of the substrate 101. In an embodiment, a number of the dummy color resist unit 130 may be two, which are respectively disposed at two diagonally opposite corners, two corners of a same side, two opposite sides, or two adjacent sides of the display area 110. In an embodiment, the number of the dummy color resist unit 130 may be four, which are respectively disposed on four corners or four sides of the display area 110. However, the number and a set position of the dummy color resist unit 130 are not limited thereto.

In an embodiment, the dummy color resist unit 130 may be designed as a triangle, a quadrangle, a hexagon, an octagon, a circle, an L-shape, a T-shape, a cross shape, or other suitable shapes. Preferably, the dummy color resist unit 130 is shaped as a quadrangle and has a first side 131, a second side 132, a third side 133, and a fourth side 134. The signal lines 140 comprise a first signal line 141, a second signal line 142, a third signal line 143, and a fourth signal line 144 which are adjacent to and parallel to the first side 131, the second side 132, the third side 133, and the fourth side 134, respectively. The dummy color resist unit 130 is set as follows: the first side 131 is at a predetermined distance a from the first signal line 141, the second side 132 is at a predetermined distance b from the second signal line 142, the third side 133 is at a predetermined distance c from the third signal line 143, and the fourth side 134 is at a predetermined distance d from the fourth signal line 144. The predetermined distances a, b, c, and d may be equal, unequal, or partially equal.

In an embodiment, the array substrate 100 further comprises a plurality of driving circuits 160 disposed on the non-display area 120 of the substrate 101. The driving circuits 160 are made of a same material as the gate electrode layers 151 of the thin-film transistors 150 and the signal lines 140. The driving circuits 160 are electrically connected to the signal lines 140 and a common voltage generating circuit (not shown). The common voltage generating circuit is configured to generate a common voltage. The common voltage makes the driving circuits 160 to generate driving signals to the gate electrode layers 151 of the thin-film transistors 150 to control switching of the thin-film transistors 150.

In an embodiment, the insulating layers 152 of the thin-film transistors 150 extend to cover the signal lines 140 and the driving circuits 160.

In an embodiment, the array substrate 100 further comprises a protective layer 155 covering the thin-film transistors 150. The protective layer 155 is made of an insulating material. The protective layer 155 may be made of a polymer insulating material such as epoxy resin, acrylic resin, polyimide resin, and polyvinyl alcohol resin, but is not limited thereto.

In an embodiment, the array substrate 100 further comprises an overcoat layer 170 covering the color resist units 124 and the dummy color resist unit 130.

In an embodiment, the array substrate 100 further comprises a light-shielding layer. The light-shielding layer 122 is configured to shield areas other than the color resist units 124 to (1) prevent light leakage from a backlight of a thin-film transistor liquid-crystal display, thereby improving a contrast ratio of the display; (2) prevent three primary color lights, generated by light from the backlight passing through adjacent red, blue, and green photoresist blocks of the color resist units 124, from being mixed, thereby improving color purity of the display, and (3) prevent light from causing malfunction of the thin-film transistor 111 and changing the operating parameters of the thin-film transistors 111. The light-shielding layer 122 may be composed of a black resin, a single-layer of chromium (Cr), or a double-layer of chromium (Cr)/chromium oxide (CrOx).

In an embodiment, the array substrate 100 further comprises a plurality of columnar photo spacers (not shown) disposed on the overcoat layer in the display area to prevent a cell gap of the display from being changed due to pressure. The photo spacers have a same height to maintain uniformity of the cell gap.

The present disclosure further provides a liquid crystal display panel comprising the aforementioned array substrate 100.

The present disclosure further provides a method for detecting alignment accuracy of a color resist layer, comprising steps S51-S53.

Step S51: providing an array substrate 100. The array substrate 100 comprises a substrate 101, a plurality of thin-film transistors 150, a plurality of signal lines 140, a plurality of color resist units 124, and a dummy color resist unit 130. The substrate 101 comprises a display area 110 and a non-display area 120 surrounding the display area 110. The thin-film transistors 150 are disposed on the display area 110 of the substrate 101. Each of the thin-film transistors 150 comprises a gate electrode layer 151, an insulating layer 152, an active layer 153, and a source-drain layer 154. The signal lines 140 are disposed on the display area 110 of the substrate 101. The signal lines 140 and the gate electrode layer 151 of the thin-film transistors 150 are made of a same material and are electrically connected to each other. The color resist units 124 are disposed on the thin-film transistors 150 and the substrate 101 in the display area 110. The dummy color resist unit 130 is disposed on a periphery of the display area 110 of the substrate 101. The dummy color resist unit 130 is made of a same material as the color resist units 124. A side or a center point of the dummy color resist unit 130 is designed to be at a predetermined distance from one of the signal lines 140.

Step S52: measuring a distance of the side or the center point of the dummy color resist unit 130 to the signal line 140 designed to be at the predetermined distance from the side or the center point.

Step S53: comparing the measured distance with the predetermined distance.

In an embodiment, the dummy color resist unit 130 is shaped as a quadrangle and has a first side 131, a second side 132, a third side 133, and a fourth side 134. The signal lines 140 comprise a first signal line 141, a second signal line 142, a third signal line 143, and a fourth signal line 144 which are adjacent to and parallel to the first side 131, the second side 132, the third side 133, and the fourth side 134, respectively. The dummy color resist unit 130 is set as follows: the first side 131 is at a predetermined distance a from the first signal line 141, the second side 132 is at a predetermined distance b from the second signal line 142, the third side 133 is at a predetermined distance c from the third signal line 143, and the fourth side 134 is at a predetermined distance d from the fourth signal line 144. The predetermined distances a, b, c, and d may be equal, unequal, or partially equal. In this embodiment, step S52 is measuring a distance of the first side 131 of the dummy color resist unit 130 to the first signal line 141, a distance of the second side 132 of the dummy color resist unit 130 to the second signal line 142, a distance of the third side 133 of the dummy color resist unit 130 to the third signal line 143, and a distance of the fourth side 134 of the dummy color resist unit 130 to the fourth signal line 144. Step S53 is respectively comparing the measured distances of the first side 131 to the first signal line 141, the second side 132 to the second signal line 142, the third side 133 to the third signal line 143, and the fourth side 134 to the fourth signal line 144 with the predetermined distances a, b, c, and d to estimate alignment accuracy of the color resist units 124.

In the above, in an array substrate and a method for fabricating the same, a method for detecting alignment accuracy, and a liquid crystal display panel which are provided by embodiments of the present disclosure, a dummy color resist unit is disposed on a periphery of a display area of a substrate, and each side of the dummy color resist unit is designed to be at a predetermined distance from an adjacent signal line. The sides of the dummy color resist unit have different, same, or partially-same predetermined distances. Therefore, it is only necessary to measure a distance between each side of the dummy color resist unit and a signal line adjacent to it, and compare the measured distance with the predetermined distance to estimate alignment accuracy of color resist units. The array substrate and the method for fabricating the same, the method for detecting alignment accuracy, and the liquid crystal display panel do not need to dispose detection units in a non-display area of the array substrate, so that an area of the non-display area can be reduced to achieve ultra-narrow frame design of the display panel. This solves the problem of limiting narrowing of a frame of a display panel due to detection units being disposed in a non-display area of a COA array substrate in the prior art.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A method of fabricating an array substrate, comprising:
   providing a substrate comprising a display area;
   forming a plurality of thin-film transistors and a plurality of signal lines on the display area of the substrate, wherein each of the thin-film transistors comprises a gate electrode layer electrically connected to one corresponding signal line of the signal lines; and
   forming a plurality of color resist units on the thin-film transistors in the display area while forming a dummy color resist unit on a periphery of the display area of the substrate, wherein the dummy color resist unit is shaped as a quadrangle, and a side of the dummy color resist unit is at a predetermined distance from one signal line of the signal lines adjacent and parallel to the side of the dummy color resist unit a side or a center point of the dummy color resist unit is designed to be at a predetermined distance from one of the signal lines.

2. The method of fabricating the array substrate according to claim 1, wherein the dummy color resist unit is formed at a corner or a side of the display area of the substrate.

3. An array substrate, comprising:
   a substrate comprising a display area;
   a plurality of thin-film transistors disposed on the display area of the substrate, wherein each of the thin-film transistors comprises a gate electrode layer;
   a plurality of signal lines disposed on the display area of the substrate and electrically connected to the gate electrode layers of the thin-film transistors;
   a plurality of color resist units disposed on the thin-film transistors in the display area; and
   a dummy color resist unit disposed on a periphery of the display area of the substrate, wherein the dummy color resist unit is shaped as a quadrangle, and a side of the dummy color resist unit is at a predetermined distance from one signal line of the signal lines adjacent and parallel to the side of the dummy color resist unit a side or a center point of the dummy color resist unit is designed to be at a predetermined distance from one of the signal lines.

4. The array substrate according to claim 3, wherein the dummy color resist unit is formed at a corner or a side of the display area of the substrate.

5. A method for detecting alignment accuracy of a color resist layer, comprising:

providing an array substrate comprising a display area, wherein the display area is provided with a plurality of thin-film transistors, a plurality of signal lines electrically connected to the thin-film transistors, a plurality of color resist units disposed on the thin-film transistors, and a dummy color resist unit disposed on a periphery of the display area, and wherein a side or a center point of the dummy color resist unit is designed to be at a predetermined distance from one of the signal lines;

measuring a distance from the side or the center point of the dummy color resist unit to the one of the signal lines designed to be at the predetermined distance from the side or the center point; and comparing the measured distance with the predetermined distance.

6. The method for detecting the alignment accuracy of the color resist layer according to claim 5, wherein the dummy color resist unit is formed at a corner or a side of the display area of the substrate.

7. The method for detecting the alignment accuracy of the color resist layer according to claim 5, wherein the dummy color resist unit is shaped as a quadrangle, and each side thereof a side of the dummy color resist unit is designed to be at the predetermined distance from one signal line of the signal lines adjacent and parallel thereto to the side of the dummy color resist unit.

* * * * *